(12) United States Patent
Ek et al.

(10) Patent No.: US 10,498,308 B2
(45) Date of Patent: Dec. 3, 2019

(54) CIRCUIT FOR CALIBRATION MEASUREMENTS, METHOD, COMPUTER PROGRAM, AND ELECTRONIC DEVICE

(71) Applicant: Telefonaktiebolaget LM Ericsson (publ), Stockholm (SE)

(72) Inventors: Staffan Ek, Lund (SE); Fenghao Mu, Hjarup (SE); Martin Anderson, Loddekopinge (SE)

(73) Assignee: TELEFONAKTIEBOLAGET LM ERICSSON (publ), Stockholm (SE)

(*) Notice: Subject to any disclaimer, the term of this patent is extended or adjusted under 35 U.S.C. 154(b) by 277 days.

(21) Appl. No.: 15/038,383

(22) PCT Filed: Nov. 27, 2013

(86) PCT No.: PCT/EP2013/074912
§ 371 (c)(1),
(2) Date: May 20, 2016

(87) PCT Pub. No.: WO2015/078499
PCT Pub. Date: Jun. 4, 2015

(65) Prior Publication Data
US 2016/0294348 A1 Oct. 6, 2016

(51) Int. Cl.
*G01R 35/00* (2006.01)
*H03H 7/01* (2006.01)
*H03K 5/24* (2006.01)

(52) U.S. Cl.
CPC ......... *H03H 7/0153* (2013.01); *G01R 35/005* (2013.01); *H03K 5/24* (2013.01); *H03H 2210/043* (2013.01)

(58) Field of Classification Search
CPC ...... G01R 35/005; G01R 27/02; G01R 27/26; G01R 1/02; H03H 7/0153; H03H 7/01;
(Continued)

(56) References Cited

U.S. PATENT DOCUMENTS 6,262,603 B1 * 7/2001 Mohan .............. H03B 5/20
327/518
6,803,813 B1 10/2004 Pham
(Continued)

FOREIGN PATENT DOCUMENTS

JP 3501912 A 4/1991
JP 2002100962 A 4/2002
(Continued)

OTHER PUBLICATIONS

PCT International Search Report, dated Jul. 14, 2014, in connection with International Application No. PCT/EP2013/074912, all pages.
(Continued)

*Primary Examiner* — Thang X Le
(74) *Attorney, Agent, or Firm* — Leffler Intellectual Property Law, PLLC

(57) ABSTRACT

A circuit for calibration measurements comprises a first and a second current source arranged to provide current outputs; a resistor connected between the first current source and a reference voltage; a capacitor connected between the second current source and the reference voltage; a discharge switch connected in parallel with the capacitor and arranged to selectively discharge the capacitor; a comparator circuit arranged to compare voltages across the resistor and the capacitor and output a signal when voltage across the capacitor reaches the voltage across the resistor; and a controller having a clock signal input and connected to the output of the comparator circuit. The controller is arranged to control the discharge switch to discharge the capacitor, change state of the switch to enable charging of the capacitor and count clock signal pulses until the comparator provides the signal when voltage across the capacitor reaches the voltage across the resistor, wherein the controller is arranged to determine a calibration measurement from counted num-
(Continued)

Fig. 3 ber of clock signal pulses. A method, computer program and electronic device are also disclosed.

20 Claims, 8 Drawing Sheets

(58) Field of Classification Search
CPC ............... H03H 7/40; H03H 2210/043; H03H 2210/025; H03H 2210/036; H03K 5/24; H03K 17/145; H03K 19/00369
See application file for complete search history.

(56) References Cited

U.S. PATENT DOCUMENTS

| | | | |
|---|---|---|---|
| 9,312,844 B2* | 4/2016 | Darmawaskita | ...... H02M 3/156 |
| 2003/0058054 A1 | 3/2003 | Endo | |
| 2005/0118980 A1 | 6/2005 | Pai et al. | |
| 2008/0191794 A1* | 8/2008 | Chiu | .................. H03H 11/1291 |
| | | | 327/553 |
| 2008/0191795 A1 | 8/2008 | Dharmalinggam et al. | |
| 2008/0258806 A1 | 10/2008 | Youssoufian et al. | |
| 2009/0096488 A1* | 4/2009 | Han | ....................... H03K 5/135 |
| | | | 327/77 |
| 2009/0140701 A1* | 6/2009 | Raidl | .................... H03H 7/0153 |
| | | | 320/166 |
| 2013/0033307 A1* | 2/2013 | Lin | ...................... H03H 7/0153 |
| | | | 327/553 |
| 2013/0082720 A1* | 4/2013 | Tang | ........................ H03J 1/005 |
| | | | 324/677 |
| 2013/0200956 A1* | 8/2013 | Hsiao | ................... H03K 3/0231 |
| | | | 331/111 |
| 2013/0207693 A1* | 8/2013 | Kao | .................. H03K 19/00369 |
| | | | 327/87 |
| 2014/0354460 A1* | 12/2014 | Park | ........................ H03M 1/18 |
| | | | 341/155 |
| 2015/0035550 A1* | 2/2015 | Chinnakonda Kubendran | ............ |
| | | | G01R 27/2605 |
| | | | 324/686 |

FOREIGN PATENT DOCUMENTS

| | | |
|---|---|---|
| JP | 2003087116 A | 3/2003 |
| JP | 2006319985 A | 11/2006 |
| JP | 2008017287 A | 1/2008 |

OTHER PUBLICATIONS

PCT Written Opinion, dated Jul. 14, 2014, in connection with International Application No. PCT/EP2013/074912, all pages.
European Communication dated Dec. 4, 2017 in connection with European Application No. 13805296.4, 6 pages.
Japanese Office Action dated Apr. 21, 2017, in connection with Japanese Application No. 2016-533600, 6 pages.
English language translation of Japanese Office Action dated Apr. 21, 2017, in connection with Japanese Application No. 2016-533600, 6 pages.

\* cited by examiner

CIRCUIT FOR CALIBRATION MEASUREMENTS, METHOD, COMPUTER PROGRAM, AND ELECTRONIC DEVICE

TECHNICAL FIELD

The present invention generally relates to a circuit for calibration measurements, a method and a computer program therefor, and an electronic device comprising the circuit for calibration measurements.

BACKGROUND

A resistor-capacitor (RC) circuit, such as RC filter or RC network, is an electric circuit composed of resistors and capacitors driven by a voltage or current signal source. A first order RC circuit can be composed of one resistor and one capacitor in series, where the product of resistance and capacitance is normally referred to as the time constant. RC circuits can be used to filter a signal by blocking certain frequencies and passing others. The three most common RC filters are the high-pass filters, low-pass filters, and band-pass filters.

An RC time constant is a value, measured in units of time, indicating the amount of time required to charge a capacitor from zero to approximately 63.2% of its full charge through a resistor. For various circuits, e.g. an integrated circuit, an RC time constant can be a very important parameter affecting the operation of various circuits therein. For example, an RC time constant can affect switching times of some circuits, determining the amount of time required to switch from a first state to a second state in digital circuitry. It is also affecting the frequency properties of RC filters.

Correct time constants of RC-circuits are particularly important in communication apparatuses. To reach a required frequency selectivity a wireless user equipment (UE) should have an approximately flat frequency response for the wanted signal, i.e. in-band, and a deep attenuation of unwanted signals, i.e. out-of-band. In a zero-IF (Intermediate Frequency) receiver the frequency selectivity is achieved by a variable bandwidth LPF (VBWLPF) as the desired signal is located around DC (Direct Current, i.e. zero frequency).

For 2G/3G/4G capable UEs, the LPF cut-off frequency needs to be configurable over a wide range of frequencies. For instance, the channel bandwidth can range from a few 100 kHz, e.g. GSM, to 36 MHz, e.g. 2×LTE20, with more than 10 different operation modes.

The accuracy of the LPF cut-off frequency is also important. If it is too wide, the unwanted interference may compress the filter, and if it is too narrow the in-band signal may be filtered out. In both cases, the signal-to-noise ratio (SNR) for the desired signal is degraded. The pole locations of an integrated active-RC LPF is determined by the RC time constant of on chip resistors and capacitors. Due to e.g. manufacturing inaccuracies and temperature variations, the cut-off frequency might deviate by as much as 40% from its nominal ("designed for") value in practice. To achieve an accurate cut-off frequency it is common practice to use an RC calibration circuit. It generates a digital control signal, used to adjust digitally tunable resistors and/or capacitors of the LPF to achieve the desired pole locations.

One method for finding the RC time constant in a circuit, e.g. on chip in an integrated circuit, is to adjust the RC time constant of an RC-oscillator until its oscillation frequency equals that of an accurate frequency reference. An example of such a technique is disclosed in US 2013/0082720A1, which describes RC calibration circuit suitable for oscillators. Using chopping, the offset effect of the comparator and current source mismatches can be compensated for. However the switching time for the discharge period is ignored, leading to a measurement error. Also the calibration method may need many cycles to get a result. Note that the oscillator based calibration needs a long time to get results, and the results are also temperature sensitive as they depend on the time it takes for switching devices to completely charge/discharge capacitors, and the speeds of switching devices are temperature dependent.

Another approach is to instead use the kind of calibration circuit shown in FIG. 1. It also locks the RC time constant to an accurate frequency reference, but does not require an oscillator. Instead, it has a comparator and a pair of current sources, one connected to a digitally tunable resistance R and the other one to an equivalent dynamic resistance $R_{eq}$ created by switched capacitors, C. The (accurate) switching frequency is here denoted $f_{sw}$ providing the equivalent dynamic resistance $R_{eq}$ as $f_{sw} \cdot C$. If R is adjusted such that voltages across the digitally tunable resistance and the equivalent dynamic resistance are equal, the time constant is given by $RC=1/f_{sw}$. The correct setting of R is found by first setting it to its smallest value, by setting a digital control value to a smallest value, and then increasing the digital control value, and thereby R, step by step until the comparator output, DATA_READ, toggles. If low-pass filter (LPF) resistors are of the same type as the resistors of the calibration circuit, the digital control value for R can be used directly in the LPF without the need for any further processing. A filter built with three capacitors, here 2 pF, and two resistors, here 20 kΩ, is preferably connected at the comparator input to improve the accuracy of the circuit by reducing the switching noise from the switched capacitors, and reducing kickback effects from the comparator. For the comparator input voltage to settle, the updating of R must be made at a lot slower pace than the switching frequency. The switching noise of the switched capacitors is further filtered by a relatively large capacitor, $C_{big}$. To make the current sources well matched, and reduce the offset of the comparator, relatively large transistors are required. To keep the thermal noise low, R must be small, or the time constant for the filter at the comparator input must be large. Also note that the small switch resistance means large switching devices, which contradicts the requirement for small parasitic capacitance meaning small switching devices. Due to high time constants and large switching devices the calibration time is rather long, about 10 μs.

US 2009/0140701A1, which relates to Auto-averaging RC time constant calibration, shows an RC time constant calibration circuit using two comparators and two switched capacitors to do the RC time constant measurement. The reason for using two capacitors/comparators is to remove the effect of the discharging period as the capacitors are charged in an interleaved way. No offset effect of the comparator is taken into account.

Thus, some of the present oscillator-based RC calibration solutions are sensitive to temperature and requires a long switching time. Other solutions for RC calibration may show other drawbacks, such as:

Accuracy. As the mismatch in the current sources and comparators lead to a certain error that is not negligible, the accuracy is limited. The digitally tuned resistor should preferably have a relatively high resistance to achieve a relatively low current consumption. However, this leads to relatively high voltage noise.

Speed. The digital control is created by a test procedure that needs to change settings for a variable capacitor or resistor until voltages across the digitally tunable resistance and the equivalent dynamic resistance are equal. It means that every setting must be tested in the worst case. Due to the analog filters for the comparator input, the settling time is long making the circuit slow.

Cost. Analog circuit elements like the relatively large capacitor, $C_{big}$, the filter at the comparator input, well matched current sources, and a low offset comparator occupies significant chip area since the matching is better for components with large area.

It is therefore a desire to provide an alternative way of RC calibration measurements.

SUMMARY

The present invention is based on the understanding that . . . .

According to a first aspect, there is provided a circuit for calibration measurements comprising a first and a second current source arranged to provide current outputs; a resistor connected between the first current source and a reference voltage; a capacitor connected between the second current source and the reference voltage; a discharge switch connected in parallel with the capacitor and arranged to selectively discharge the capacitor; a comparator circuit arranged to compare voltages across the resistor and the capacitor and output a signal when voltage across the capacitor reaches the voltage across the resistor; and a controller having a clock signal input and connected to the output of the comparator circuit. The controller is arranged to control the discharge switch to discharge the capacitor, change state of the switch to enable charging of the capacitor and count clock signal pulses until the comparator provides the signal when voltage across the capacitor reaches the voltage across the resistor, wherein the controller is arranged to determine a calibration measurement from counted number of clock signal pulses.

The circuit may further comprise a switching arrangement enabling an alternative connection comprising that the second current source is selectably connected to the resistor instead, and the first current source is selectably connected to the capacitor instead, wherein the controller further is arranged to control enabling of the alternative connection and to make a second determination of counted clock signals for the alternative connection, and the calibration measurement is determined from the two counts of clock signal pulses. The switching arrangement may comprise a first switch having an input connected to the first current source and arranged to selectively connect the first current source to either a first node connected to a first terminal of the resistor and a first input of the comparator, or a second node connected to a first terminal of the capacitor and a second input of the comparator; and a second switch having an input connected to the second current source and arranged to selectively connect the second current source to either the second node or the first node. Alternatively, the switching arrangement may be arranged to enable a swap of the comparator inputs with each other. The switching arrangement may comprise a first switch having an input connected to the first current source and a first input of the comparator and arranged to selectively connect the first current source to either a first node connected to a first terminal of the resistor, or a second node connected to a first terminal of the capacitor; and a second switch having an input connected to the second current source and a second input of the comparator and arranged to selectively connect the second current source to either the second node or the first node.

The circuit may further comprise a filter capacitor connected in parallel with the resistor and arranged to low-pass filter noise caused by the resistor.

A calibration value may be determined from the calibration measurement through a look-up table mapping calibration measurements to calibration values.

A calibration value may be determined from the calibration measurement through a computing arrangement arranged to compute a ratio between the counted number of clock pulses and a value indicating a number of clock pulses associated with a desired combination of resistance and capacitance. A compensation value for systematic latency in the circuit may be provided, wherein a denominator of the ratio comprises a difference between the counted number of clock pulses and the compensation value. The resistor may have a programmable resistance controlled by a resistor control value, and/or the capacitor has a programmable capacitance controlled by a capacitance control value, wherein the computation arrangement is arranged to adjust the calibration value for the setting of resistor control value and/or capacitor control value at the calibration measurement. Computations by the computation arrangement may be made for a plurality of programmable resistor or capacitance values and are stored for each programmable value, wherein the resistor or capacitance value is comprised in the denominator of the ratio.

According to a second aspect, there is provided a method for a calibration measurement circuit according to the first aspect. The method comprises controlling the discharge switch to discharge the capacitor; clearing a counter; changing a state of the switch to enable charging of the capacitor; counting clock signal pulses until the comparator provides the signal when voltage across the capacitor reaches the voltage across the resistor; and determining a calibration measurement from the counted number of clock signal pulses.

The method may further comprise forming an alternative connection comprising that the second current source is connected to the resistor instead, and the first current source is connected to the capacitor instead; and making a second determination of counted clock signals for the alternative connection, wherein the calibration measurement is determined from the two counts of clock signal pulses. The forming of the alternative connection may also comprise swapping the comparator inputs with each other.

The method may comprise determining a calibration value from the calibration measurement through a look-up table mapping calibration measurements to calibration values.

The method may comprise determining a calibration value from the calibration measurement by computing a ratio between the counted number of clock pulses and a value indicating a number of clock pulses associated with a desired combination of resistance and capacitance. The method may comprise providing a compensation value for systematic latency in the circuit, wherein a denominator of the ratio comprises a difference between the counted number of clock pulses and the compensation value. The resistor may have a programmable resistance controlled by a resistor control value, and/or the capacitor has a programmable capacitance controlled by a capacitance control value, wherein the method comprises adjusting the calibration value for the setting of resistor control value and/or capacitor control value at the calibration measurement. The method may comprise computing calibration values for a plurality of programmable resistor or capacitance values; and storing the computed calibration values for each programmable value, wherein the resistor or capacitance value is comprised in the denominator of the ratio.

According to a third aspect, there is provided a computer program comprising computer executable instructions which when executed by a programmable controller of an electronic circuit for performing calibration measurements causes the controller to perform the method according to the second aspect.

According to a fourth aspect, there is provided an electronic device comprising a circuit according to the first aspect. The electronic device may be a communication apparatus.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Embodiments of the present invention are based on the following principles:

When a resistor, grounded at one end and having a resistance R, is supplied with a current $I_R$, the voltage across the resistor is $V_R = I_R \cdot R$. When an initially discharged capacitor, grounded at one end and having a capacitance C, is supplied with a constant current $I_C$, the voltage across the capacitor is $V_C = (I_C \cdot t)/C$, where t denotes the time since the capacitor began to be charged. When $I_R = k \cdot I_C$ the time t for which $V_R = V_C$ is readily derived to be equal to a scaled time constant $k \cdot R \cdot C$, where k is a scaling factor. If k=1, this time is equal to the RC time constant. Thus, the RC time constant can be measured by measuring the time it takes for the capacitor to be charge to $V_C = V_R$. Measuring this time can e.g. be done by a counter circuit counting clock pulses of a reference clock signal having a well-defined frequency, such as a clock signal derived directly or indirectly (e.g. using a phase-locked loop) from a crystal oscillator. The detection of the event that $V_R = V_C$ can be made with a voltage comparator, the output of which can be used to instruct the counter to stop counting. This is a comparably fast way of measuring the RC time constant, since in principle, the RC time constant can be measured in a single charge/discharge cycle of the capacitor (although some embodiments presented below make use of two such cycles to compensate for e.g. offset errors and/or current mismatch). Even though manufacturing inaccuracies etc. can make actual RC constants of integrated RC circuits deviate relatively much from nominal values, there is typically a strong correlation between such deviations for RC circuits (using the same types of resistors and capacitors) integrated on the same integrated circuit chip (as opposed to RC circuits integrated on different integrated circuit chips). Thus, if the RC time constant has been measured (e.g. using the principles outlined above) for a reference RC circuit on one chip, this measured RC time constant can be used to relatively accurately tune the RC time constants of other RC circuits on that same chip.

According to embodiments, the currents $I_R$ and $I_C$ can be made equal. "Equal" should here be construed with practical technical implementation in mind where some deviation may occur due to for example manufacturing process accuracy, temperature gradients, etc. For the sake of easier understanding of principles, the embodiments demonstrated with reference to the figures assume that the currents $I_R$ and $I_C$ are equal. According to other embodiments $I_R$ and $I_C$ are scaled by a factor of k, and computations are then made taking the scaling into account. In other senses, the features demonstrated below apply for these other embodiments.

Figure 1:
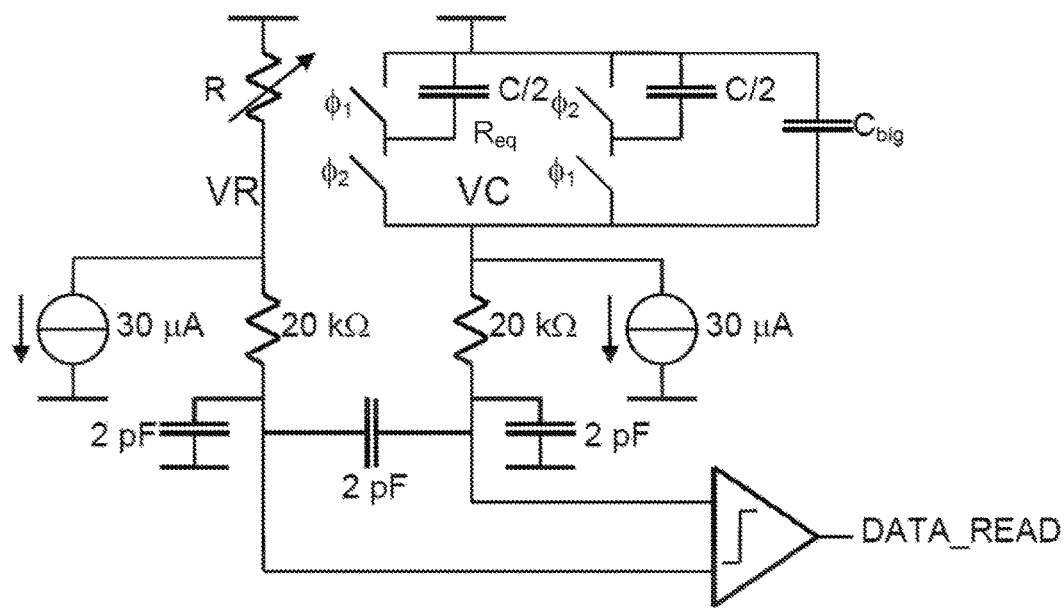
FIG. 1 illustrates an example of a conventional calibration circuit
Figure 2:
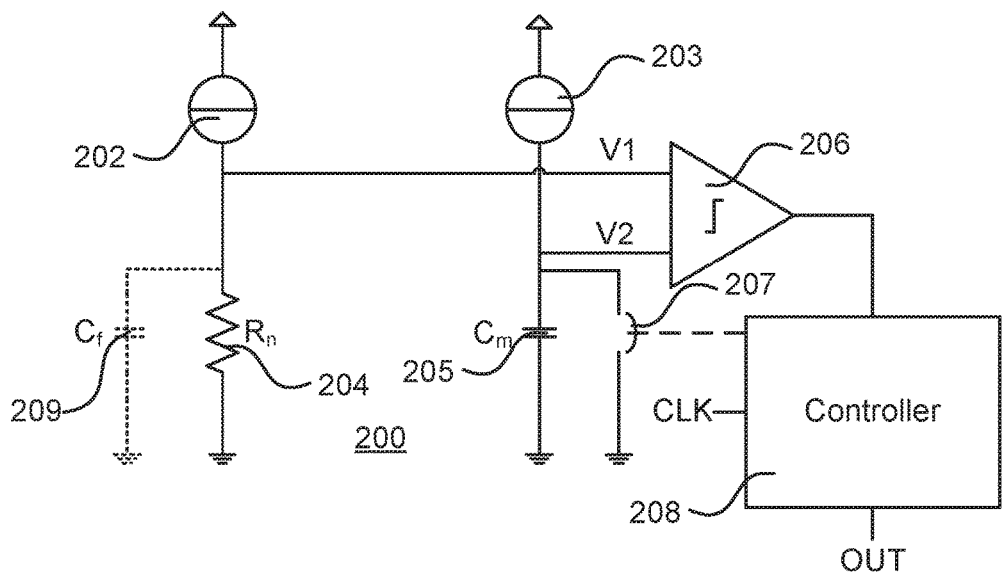
FIG. 2 schematically illustrates a circuit for calibration measurements according to an embodiment.

FIG. 2 schematically illustrates a circuit 200 for calibration measurements according to an embodiment. A first current source 202 and a second current source 203 are arranged to provide equal current outputs. Here, "equal" should be considered in its technical context, where the two current sources 202, 203 are made to provide as equal current outputs as possible with practical means at hand. As will be demonstrated below, current mirroring techniques can be used for this. Other ways of keeping the output currents as equal as possible are of course also feasible. The first current source 202 provides its current output to a first terminal of a resistor 204 which is connected by a second terminal to a reference voltage, e.g. ground. Similarly, the second current source 203 provides it current output to a first terminal of a capacitor 205 which by a second terminal is also connected to the reference voltage.

Thus, the first current source 202 will provide a current through the resistor 204 wherein a voltage will be created across the resistor 204. The second current source 203 will charge the capacitor 205 which will build up a voltage across the capacitor 205. After a while, the voltage across the capacitor 205 will reach the level of the voltage across the resistor 204. The time for reaching this state will be used for the calibration measurement.

A comparator circuit 206 is connected to respective nodes where the voltages across the resistor 204 and capacitor 205, respectively, are present. Thereby, the comparator circuit 206 is capable to provide an output signal indicating when the voltage across the capacitor 205 reaches the same value as that across the resistor 204. To ensure that the capacitor is discharged when the charging by the second current source 203 commences, a discharging switch 207 is provided in parallel with the capacitor 205. The switch 207 is controlled by a controller 208. The controller 208 also receives the output from the comparator circuit 206 and a clock signal. The controller 208 thus discharges the capacitor 205 by closing the switch 207, opens the switch 207 to enable charging of the capacitor 205 and starts counting clock pulses of the clock signal until the controller receives a signal from the comparator circuit 206 that the capacitor voltage has reached the resistor voltage. A calibration value can then be computed based on the number of counted clock pulses. As will be demonstrated below, the computation can be performed by fairly simple arithmetic computations, but can also be pre-calculated wherein the calibration value is read from a look-up table based on the number of counted clock pulses. As also demonstrated below, the calibration value may be a vector or matrix for different settings of the RC-circuit to be calibrated.

It can thus be seen that the approach provides a fast result since the calibration value is obtainable after one measurement period, i.e. one discharging and charging of the capacitor to resistor voltage and a following arithmetic computation/look-up table access, which provides significantly shorter time than some of the approaches described in the background section. Below, it is described embodiments where two consecutive such measurement periods are made to compensate for comparator offset and/or current mismatch, but these still provide a relatively fast result since the discharging and charging of the capacitor, even if made twice, take relatively little time.

Current through a resistor inherently generates noise. To avoid or at least alleviate the effect of that noise on the input of the comparator 206, a filter capacitor 209 may optionally be connected in parallel with the resistor 204 which then low-pass filters the noise contribution at the input of the comparator 206.

Figure 3:
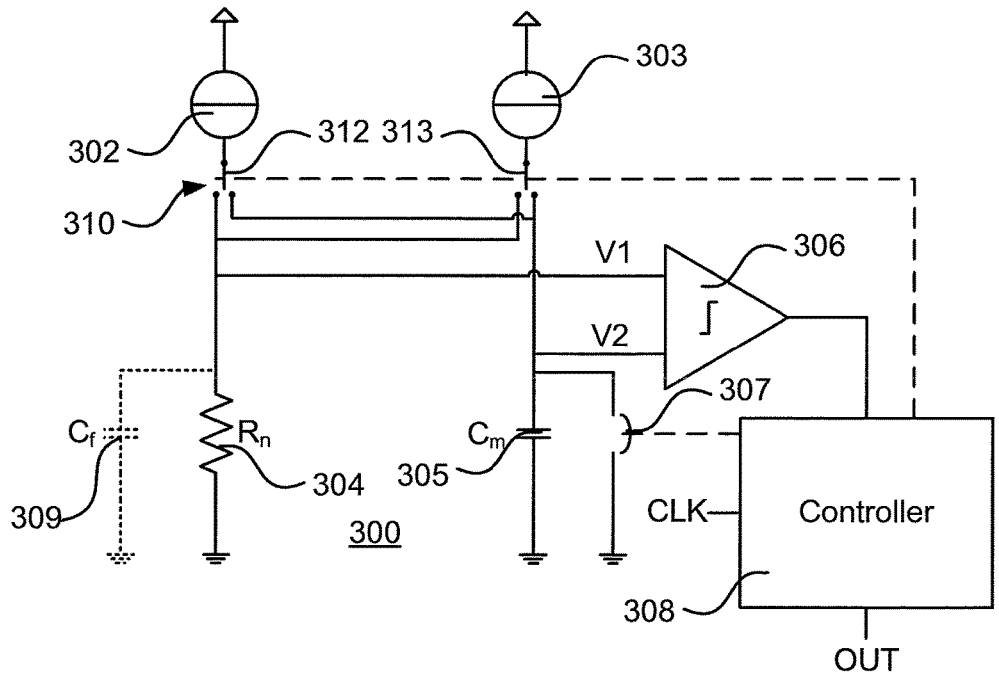
FIG. 3 schematically illustrates a circuit for calibration measurements according to an embodiment.

FIG. 3 schematically illustrates a circuit 300 for calibration measurements according to an embodiment. A first current source 302 and a second current source 303 are arranged to provide equal current outputs. Although the two current sources are arranged to provide equal current outputs, there may be a slight difference between the respective currents. A switching arrangement 310 is therefore provided to enable swapping of the two current sources 302, 303 such that a resistor 304 can be subject to any of the current sources 302, 303 and similar that a capacitor 305 can be subject to any of the current sources 302, 303. The measurement is thus made twice (referred to below as the first and the second measurement), i.e. one time with one combination of resistor 304 and capacitor 305 to respective current sources 302, 303, and one time with another combination of the current sources 302, 303 to the resistor 304 and capacitor 305. For example, for the first measurement, the first current source 302 provides its current output to a first terminal of the resistor 304 which by a second terminal is connected to a reference voltage, e.g. ground. This may be provided with a switch 312 of the switching arrangement 310. The second current source 303 simultaneously provides its current output to a first terminal of the capacitor 305 which by a second terminal is also connected to the reference voltage. This may be provided with a switch 313 of the switching arrangement 310. The first measurement is then provided the same way as demonstrated with reference to FIG. 2, i.e. a controller 308 discharges the capacitor 305 by closing a switch 307, opens the switch 307 to enable charging of the capacitor 305 and starts counting clock pulses of the clock signal until the controller receives a signal from a comparator circuit 306 that the capacitor voltage has reached the resistor voltage. For the second measurement, the switches 312, 313 of the switching arrangement are then toggled, and the measurement procedure is performed once again. Thus, for the second measurement, the first current source 302 provides its current output to the first terminal of the capacitor 305, and the second current source 303 provides its current output to the first terminal of the resistor 304. A calibration value can then be computed based on the number of counted clock pulses. The number of clock pulses can then be an aggregate counted clock pulses, or be an average of the two counts, which is essentially in practice only a bit-shift, i.e. division by two, of the aggregate count in a binary representation.

An optional filter capacitor 309 may, similar to what has been demonstrated with reference to FIG. 2, be connected in parallel with the resistor 304. The filter capacitor 309 is dimensioned to filter out high-frequency noise and/or to reduce kickback effect of the comparator.

A further problem may be that the comparator may have an inherent offset between the inputs. This can be combated by swapping the inputs of the comparator as well and make measurements with the different configurations. This can be made by adding switches for the swapping. However, this increases complexity by additional switches, which also may have other unwanted effects if not arranged properly. As demonstrated below, an approach may be used which does not increase complexity compared to the solution demonstrated with reference to FIG. 3, but where swapping of comparator inputs is provided.

Figure 4:
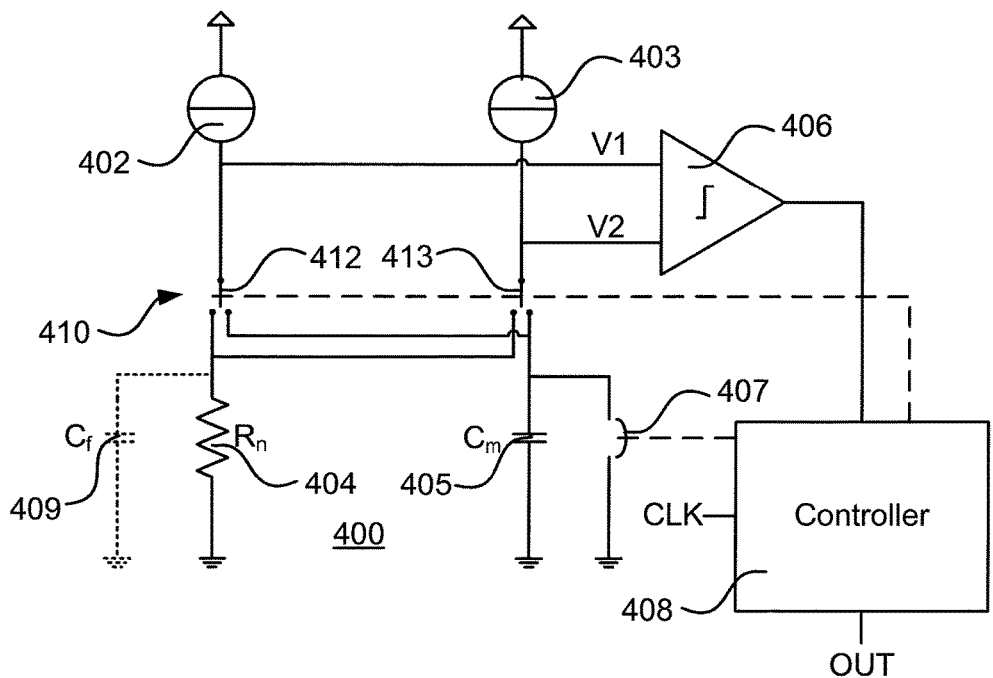
FIG. 4 schematically illustrates a circuit for calibration measurements according to an embodiment.

FIG. 4 schematically illustrates a circuit 400 for calibration measurements according to an embodiment. Similar to the embodiment demonstrated with reference to FIG. 3, the embodiment of FIG. 4 comprises a first current source 402, a second current source 403, a resistor 404, a capacitor 405, a comparator 406, a discharging switch 407, a controller 408 and a switching arrangement 410. The switching arrangement 410 comprises a first and a second switch 412, 413. The first switch 412 has an input connected to the first current source 402 and a first input of the comparator 406 and is arranged to selectively connect the first current source 402, and thus the first input of the comparator 406, to either a first node connected to a first terminal of the resistor 404, or a second node connected to a first terminal of the capacitor 405. The second switch 413 has an input connected to the second current source 403 and a second input of the comparator 406 and is arranged to selectively connect the second current source 403, and thus the second input of the comparator 406, to either the second node or the first node. By arranging the inputs of the comparator 406 such that the switching arrangement 410 is between the connection nodes of the respective inputs and the resistor 404 and the capacitor 405, the inputs of the comparator 406 are also swapped. Thereby, any offset in the comparator is taken care of simultaneously with any offset between the current sources 402, 403 without increasing complexity compared to the solution demonstrated with reference to FIG. 3.

An optional filter capacitor 409 may, similarly to what has been demonstrated with reference to FIG. 2, be connected in parallel with the resistor 404.

Figure 5:
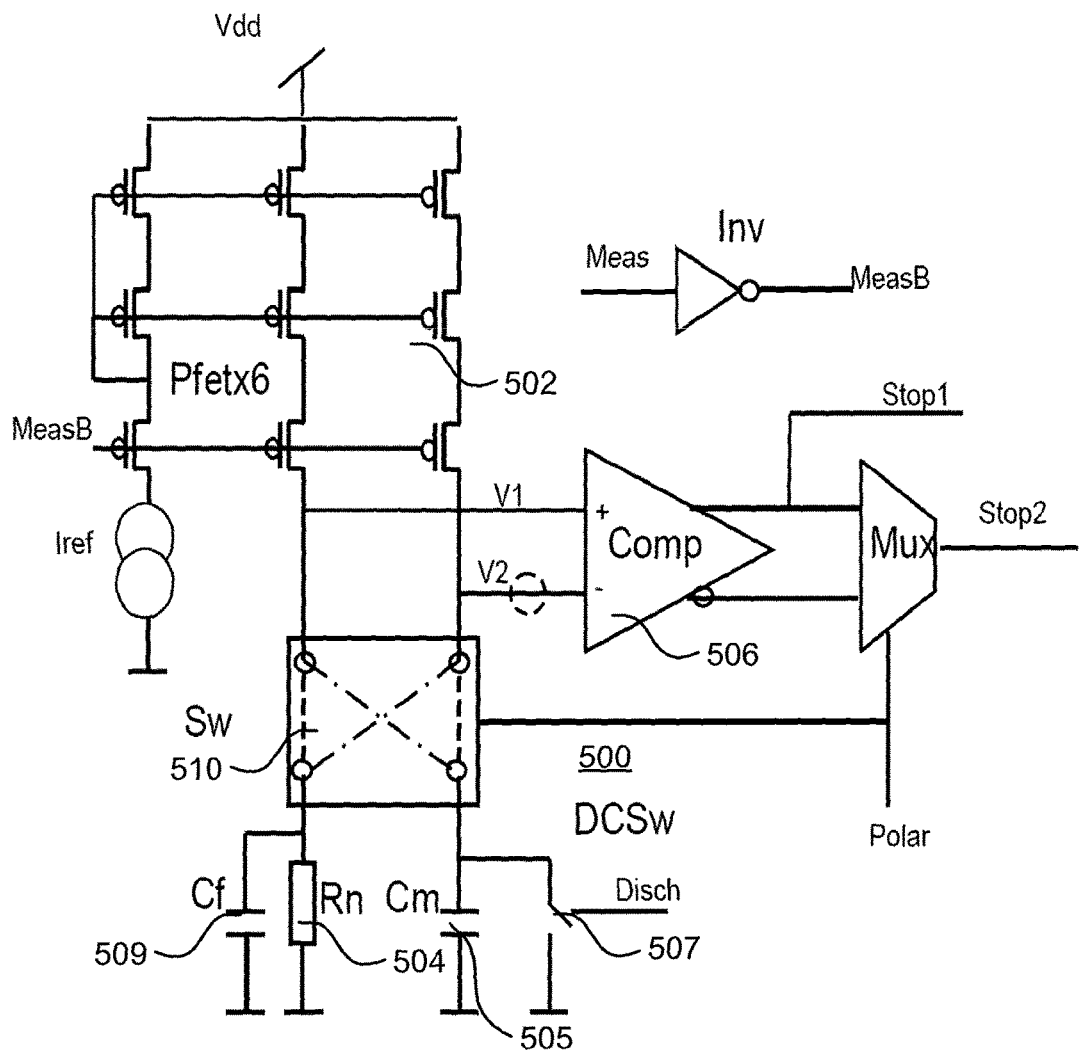
FIG. 5 schematically illustrates a circuit for calibration measurements according to an embodiment.

FIG. 5 illustrates a circuit 500 for calibration measurements according to an embodiment. The exemplary circuit 500 for Toggled Sample RC time constant Measurement comprises a current source arrangement 502 including 6 pFET transistors which form two current branches for measurement. A comparator 506 compares the differential inputs in nodes V1 and V2. Discharge switch 507 is a switch for discharging a sample capacitor 505, so after discharge, the capacitor 505 can be charged from zero voltage level. A sample resistor 504 has resistance Rn and the sample capacitor 505 has capacitance Cm, which will be referred to below, and the values Cm and Rn can be either fixed or programmable.

The voltage on capacitor 505 charged by a current i(t) is $$VCm = VC = \frac{1}{Cm}\int_0^t i(t)dt$$

When the charging current i(t) is a constant i, and the charging is from t=0, $$VC = \frac{i \cdot t}{Cm}$$

While the voltage VR on the resistor 504 is iRn, when VR=VC, we have t=RnCm. This could be reached when the charging current i(t) is constant. In fact, as long as the current is constant, the RC measurement is independent of the current strength. However in practice of an implementation, like FIG. 5, i(t) is preferably properly chosen so that VR is a small portion of the supply voltage and the current of the current source 502 formed by the 6 transistors is operated in a voltage range that provides a current very close to a constant. The signal indicated "Meas" is a start signal for a measurement, and the signals indicated "Stop1" and "Stop2" are used to finish the measurement when V2 equals V1 for a two-period measurement. Normally a two-period measurement is accurate enough for most circuit design requirement with such arrangement, but M-period measurement can be also used for further improvement of accuracy, where M is an even number.

Figure 6:
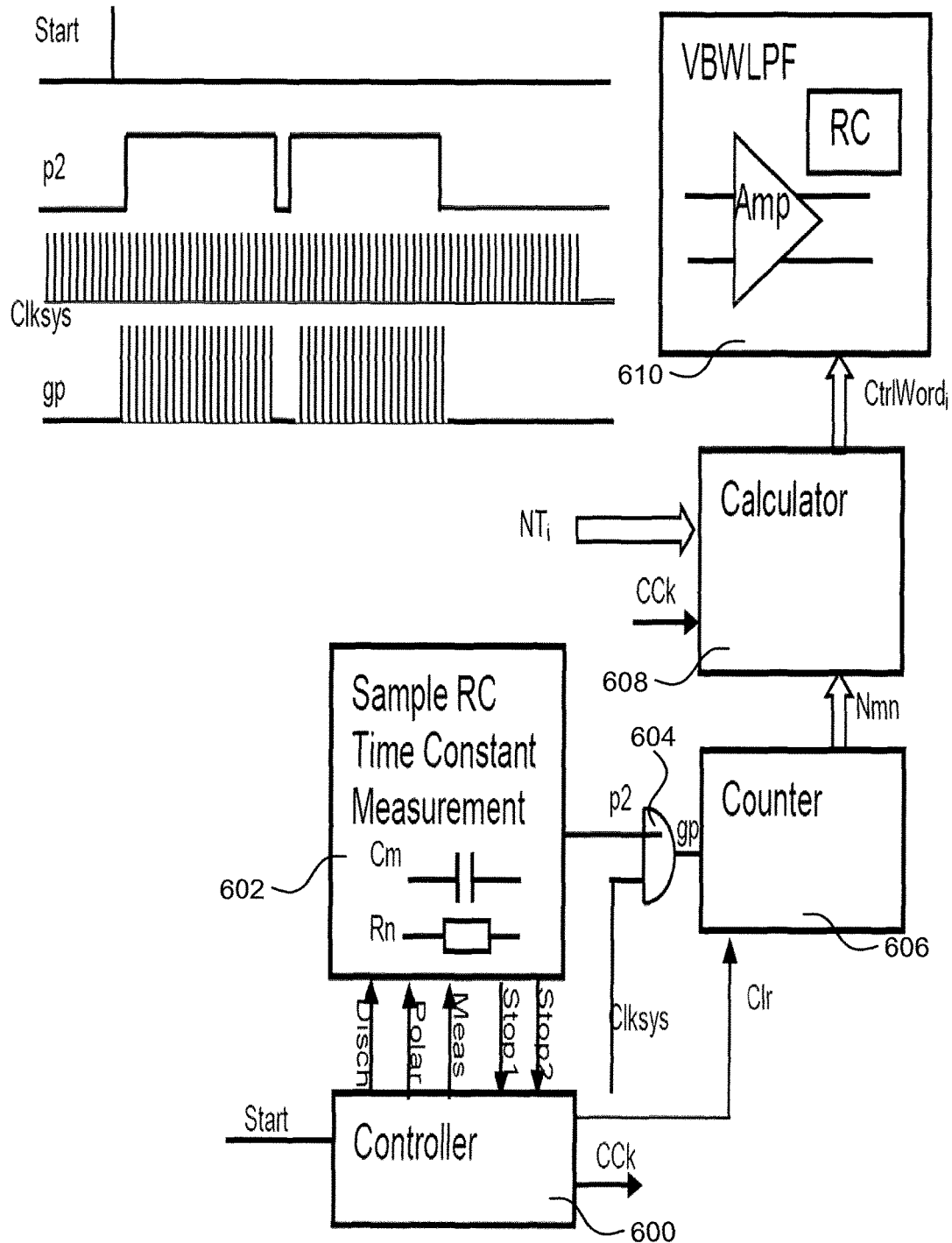
FIG. 6 schematically illustrates a timing diagram and a block diagram.

FIG. 6 schematically illustrates a timing diagram and a block diagram for understanding the principle of calibration measurement. The block diagram shows a controller 600 providing control signals to a sample RC time constant measurement circuit 602, which may be according to any of the circuits 300, 400, 500 demonstrated above, and also for circuit 200 when considering particulars discussed below. The controller 600 also receives status signals from the sample RC time constant measurement circuit 602. A gate 604 receives a clock signal and a signal used for gating which opens the gate from start of charging the capacitor of the circuit 602 until the capacitor voltage has reached the resistor voltage of the circuit 602. A gated pulse signal, gp, is thus provided which represents the time it takes for the voltage across the capacitor to reach the voltage across the resistor, i.e. represents the RC time constant. The pulses of the gated pulse signal are counted by a counter 606 and the count is provided to a computing arrangement 608 for making a calibration of a circuit 610 comprising an RC circuit to be calibrated. The circuit 610 may be a filter, e.g. a variable bandwidth low-pass filter as indicated in FIG. 6, but may of course be any other filter, or circuit, comprising an RC circuit which needs to be calibrated to a desired time constant. The calibration may be made from a control word representing a control value for a desired setting, wherein the control word may be computed by the computing arrangement 608 from the measured time, i.e. the counts from the counter 606, and provided information about target time constants for respective settings. The computing arrangement can thus provide a vector or matrix of control words for the various settings.

The timing diagram indicates the performing of two measurement periods where the gating signal is made high first for the first measurement and then made high for the second measurement. The principle of using only one measurement period, i.e. applicable for the circuit 200 demonstrated with reference to FIG. 2, can also be readily understood therefrom, wherein only the first part of the gating signal is utilised.

To reach higher measurement accuracy, a filter capacitor $C_f$ may be used to reduce the thermal noise during comparison. The current in the branch may be weak and the resistance Rn may be large, which may result in large voltage noise. Besides the thermal noise, some comparators often have a kick-back effect when the comparator is toggling the output, which may increase measurement error too. With the aid of the filter capacitor, the thermal noise is low pass filtered and the kick-back effect introduced by the comparator is reduced, thus improving the measurement accuracy.

The input of the comparator may have an offset caused by process mismatch. In addition, the current source branches may also have mismatch. To reach higher measurement accuracy, one way to alleviate this mismatch is to increase the device sizes in the comparator and current sources, but this may make the circuit slow and having large parasitics, which in turn will introduce measurement errors as well. While the solution mentioned above is the two-period measurement where a switching arrangement is used to flip connections between the nodes of connection of the comparator and the R and C branches, so that the input offset due to the comparator and current source mismatch is cancelled effectively. This solution is able to be combined with the use of the filter capacitor demonstrated above.

Figure 7:
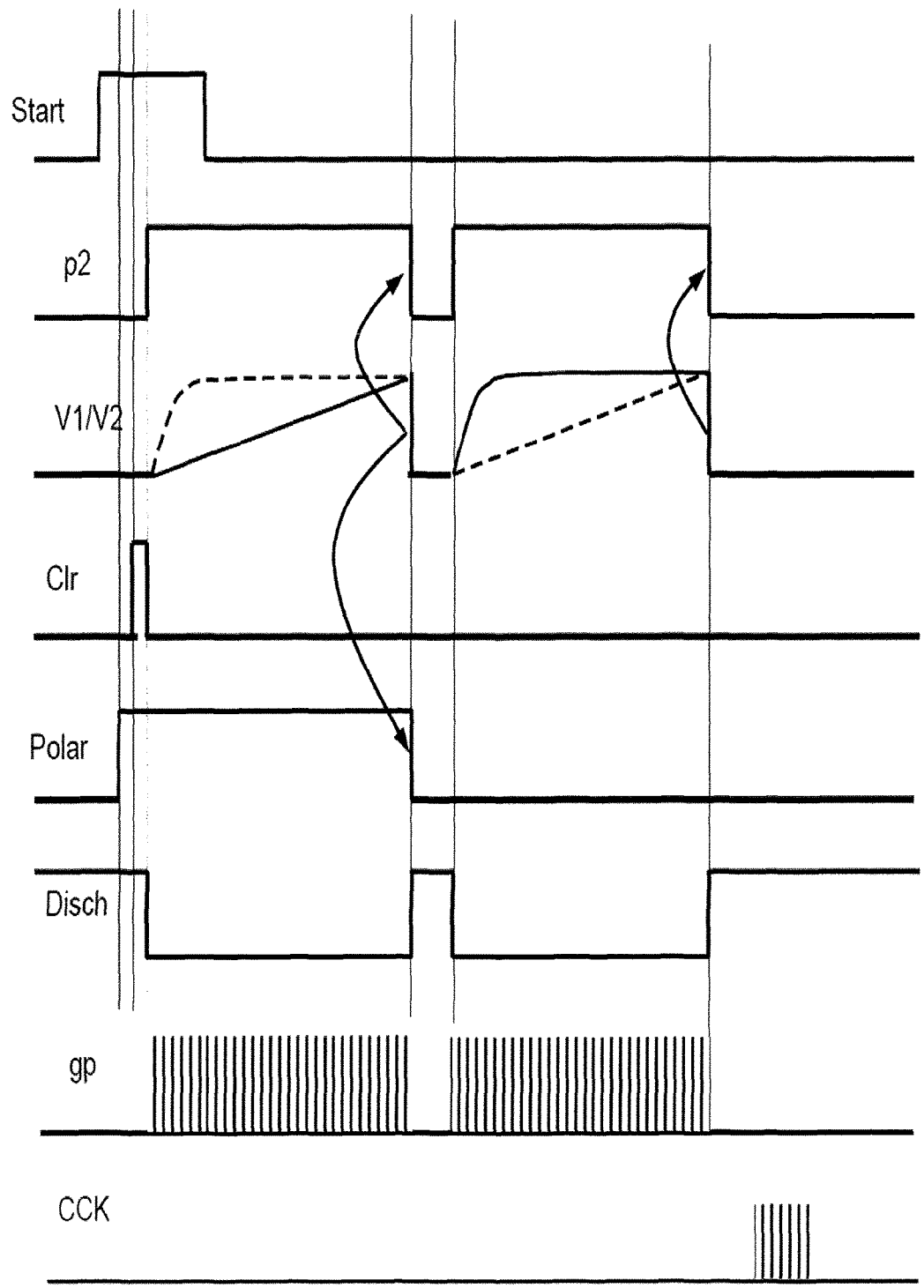
FIG. 7 is a timing diagram schematically illustrating a measurement using two measurements.

FIG. 7 is a timing diagram schematically illustrating a measurement using two measurements as e.g. suggested with reference to FIGS. 4 and 5. The corresponding principle for a one-shot measurement as suggested with reference to FIG. 2 can readily be understood from the illustration of FIG. 6 and the corresponding disclosure as well. A "Start" signal may enable the calibration process which begins with discharge of the capacitor Cm, i.e. the control signal "Disch" is in a state engaging the discharge switch to short-circuit the capacitor, a polarity signal "Polar" is set to a first value setting one of the connections by the switching arrangement and a counter clearing signal "Clr" is set such that the counter is cleared. Once this is done, the discharge and clear signals are set back to respective other states, and the first measurement period is performed, starting with the first rising edge in pulse "p2". The comparator will sense the difference between node voltages V1 and V2 and when V1=V2, it will flip its output and this will lead to reset of "p2", toggle of polarity signal "Polar", and discharge of the capacitor Cm for the second period measurement by setting the control signal "Disch" in discharge state again. Thereafter, the control signal "Disch" is set back to its other state and the procedure begins the second measurement period, and the comparator will sense the difference between its input node voltages V1 and V2 again. When V1=V2 it flips the output and this will lead to reset of "p2" for the second time. The waveforms for V1/V2 are either a line with a charging slope, or the curve of a 1st order RC circuit having an exponential response. Note that any filter capacitor $C_f$ should be chosen so that it is charged much quicker than the capacitor charging branch when a filter capacitor is used. The counter will count the system clock as long as p2 is high, and when the two-period measurement is finished, it accumulates the total number of clock pulses in the gated pulse signal "gp", i.e. the system clock gated by p2. That total number corresponds to two times the time constant of the sample RC components (2·Nmn considering the notation of FIG. 6). As indicated above, a total number corresponding to the time constant can be achieved by just throw away the least significant bit (LSB) for the division of 2. The LSB can also be kept in the computation for further processing, and the division is performed after all control words are obtained, for better accuracy. The two-period measurement removes the mismatch impact on the result, also making the measurement less sensitive to temperature changes. A one-period measurement would correspond to the left half of the diagram, and the polarity signal "Polar" would not be present.

After the two-period measurement, a set of clock pulses at signal "CCK" may be created by the controller, and the computing arrangement may use these pulses to compute required control words for a variable bandwidth low-pass filter VBWLPF if the computing arrangement is implemented in on-chip hardware.

Figure 8:
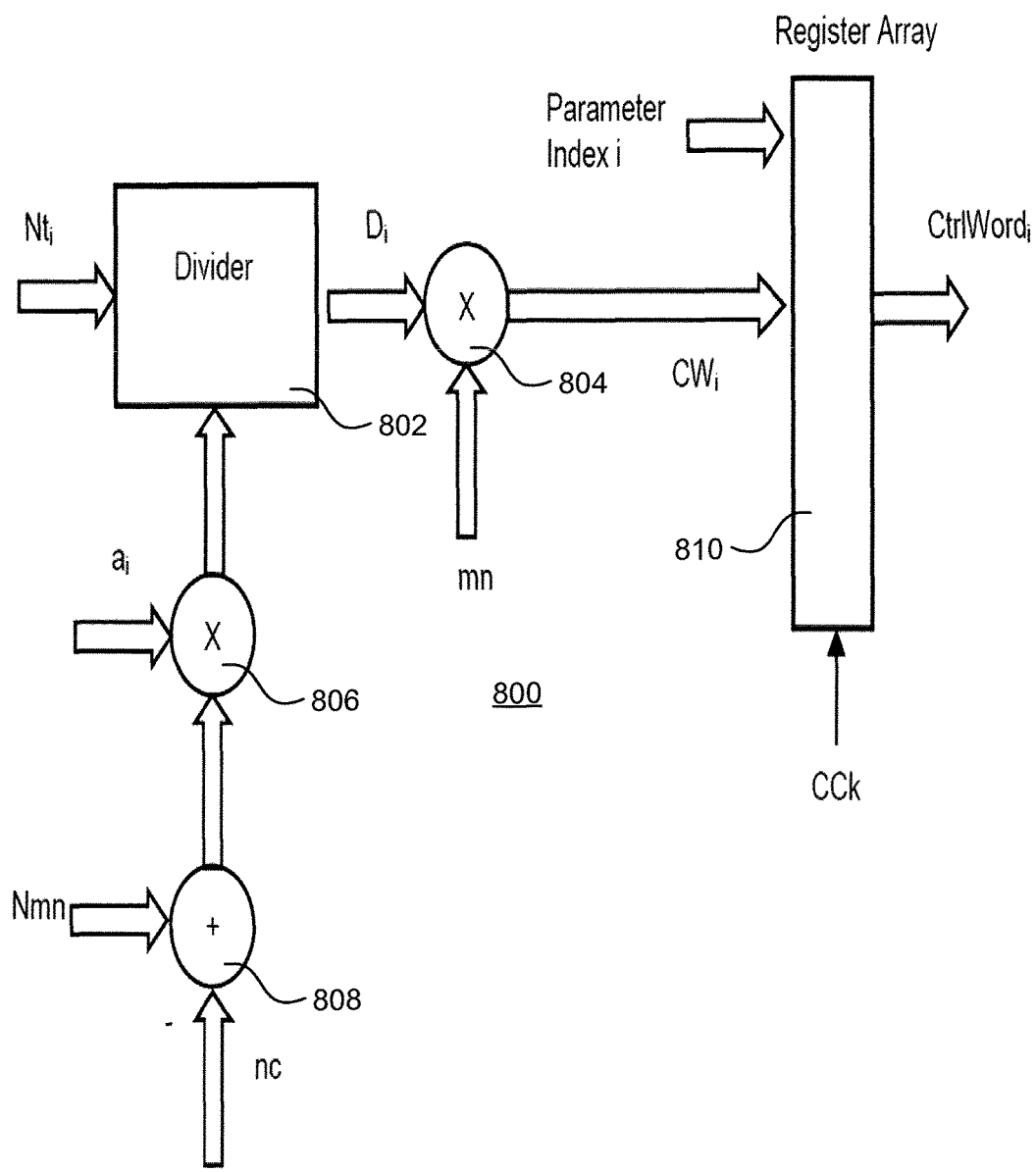
FIG. 8 is a block diagram schematically illustrating a computing arrangement.

FIG. 8 is a block diagram schematically illustrating a computing arrangement 800 of a control word according to an embodiment. The control word, or vector or array of control words, can for example be used for a filter or circuit, similar as demonstrated with reference to FIG. 6.

The resistors of the circuit to be calibrated may be tuned linearly in a range with a programmable control word, for instance, a resistor with a fixed part $R_o$ in series with a programmable part $R_p$, where a unit resistance $r_o$ can be used for explaining a feasible approach. The fixed part may for example have a resistance $R_o$ which is $r_o \cdot a_0$, and the programmable part may have a resistance $R_p$ which is $r_o \cdot p$, where $a_0$ and p are integers. The aggregate resistance then becomes $R_a$, i.e.

$$R_a = R_o + R_p = r_o \cdot a_0 + r_o \cdot p = r_o(a_0 + p) = r_o \cdot a,$$

where a is an integer, $a_{max} \geq a \geq a_0$ with $a_{max}$ representing largest resistance value, and $a = a_0 + p$.

Similarly, a capacitor built with programmable unit cells connected in parallel can be expressed as $$C_b = c_0 \cdot b$$

where $b_{max} \geq b \geq b_0$ and b is an integer too, and $b_{max}$ representing a largest capacitance value.

The target time constant $T_t$ for the calibration can be expressed as $$T_t = R_a \cdot C_b = r_o \cdot c_o \cdot a \cdot b = t_o \cdot a \cdot b$$

where $t_o$ is a unit cell time constant.

The sample resistor and capacitor in the sample RC time constant measurement, SRCM, circuit are also designed in a similar way, so $$R_n = r_o \cdot n,$$

and $$C_m = c_o \cdot m$$

where n and m are integers. The $R_n$ and $C_m$ may be programmable or may be built with a fixed number of series or parallel units, i.e., n and m, respectively. We can define the unit cell time constant $t_o$ for a RC unit cell as for the circuit to be calibrated, i.e. $t_o = r_o \cdot c_o$. With this in mind, we can express the time constant for the sampling RC components as $$T_{mn} = R_n \cdot C_m = t_o \cdot m \cdot n$$

In practice, the resistor and capacitor components normally may occupy a relative large area, such that the matching accuracy is sufficient. However, the unit cell time constant $t_o$ for the RC unit is process dependent which may lead to as large as +/−25% error. The calibration work aims at finding a proper control number, e.g. represented with a control word in binary format, for a targeted time constant in e.g. an RC based low pass filter design, i.e, the values for a and b when both R and C can be programmable, or the number b when only C is programmable, or the number a when only R is programmable.

To calibrate e.g. VBWLPF, the task is further to find multiple time constants $T_{t1}, T_{t2}, \ldots T_{tn}$ accordingly. For the i:th targeted time constant $T_{ti}$, we can have $$T_{ti} = t_o \cdot a_i \cdot b_i = t_o \cdot M_i$$

where $M_i$ is the product of the control numbers. As $$t_o = \frac{T_{ti}}{a_i \cdot b_i} = \frac{T_{mn}}{m \cdot n}$$

we have $$M_i = a_i \cdot b_i = \frac{T_{ti}}{T_{mn}} \cdot m \cdot n$$

If we use $T_{mn}$ as the counting time for a counter running at a system clock frequency $f_{cks}$, the counted number in the end is $N_{mn} = T_{mn} \cdot f_{cks}$ and the targeted time constant can be converted also in a number counted in cycles of $f_{cks}$, i.e. $N_{ti} = T_{ti} \cdot f_{cks}$. So we can get the control number $M_i$ for i=1, 2, ..., $I_n$, assume that there are $I_n$ time constants in the VBWLPF:

$$M_i = a_i \cdot b_i = \frac{T_{ti} \cdot f_{cks}}{T_{mn} \cdot f_{cks}} \cdot m \cdot n = \frac{N_{ti} \cdot m \cdot n}{N_{mn} \cdot a_i}$$

To implement the time constants, one may prefer to first fix one of the parameter $a_i$ or $b_i$. For instance, we fix $a_i$, i.e, use a fixed resistor $R_{ai} = r_o \cdot a_i$, then $b_i$ can be computed according to:

$$b_i = \frac{T_{ti} \cdot f_{cks}}{T_{mn} \cdot f_{cks} \cdot a_i} \cdot m \cdot n = \frac{N_{ti} \cdot m \cdot n}{N_{mn} \cdot a_i}$$

which can be translated into binary control words so that the filter is calibrated and the zeros and poles will be independent of process change, i.e, the change of the unit time constant $t_o$.

In general, due the circuit latency introduced by the comparator and control logic, the measured time constant for $T_{mn}$ may be a bit larger than the real one. As it is a constant positive error, a compensation can be added as $$b_i = \frac{N_{ti} \cdot m \cdot n}{(N_{mn} - n_c) \cdot a_i}$$

where $n_c$ is a compensation item which is usually very small, and $b_i$ is the control value represented by the control word.

For the VBWLPF multiple RC component parameters calibration, the control word can be created either by a micro controller, an on chip parameter computing arrangement implemented in hardware or extracted from a predefined lookup table. A schematic of the an embodiment of the computing arrangement 800 implemented in application-specific hardware is shown in FIG. 8, where a digital divider 802, a first multiplier 804, a second multiplier 806, and an optional adder 808 are included, performing the mathematic computation of $b_i$ elucidated above as a control word $CW_i$, which may be stored in a register array 810 for providing respective control word $CtrlWord_i$ to the RC circuit to be calibrated for a specific setting of $N_{ti}$ and $a_i$. The analogous approach would apply for a specific setting of $N_{ti}$ and $b_i$, or a specific setting of $N_{ti}$ and $a_i$ and $b_i$, where a matrix of values are computed for each combination of $a_i$ and $b_i$.

Figure 9:
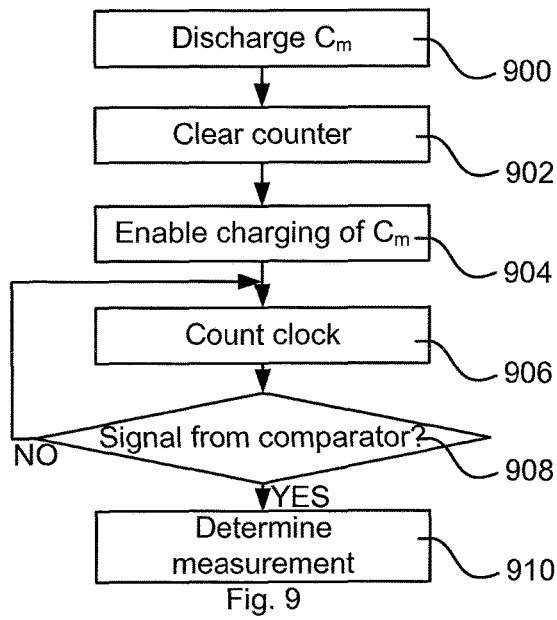
FIG. 9 is a flow chart illustrating a method according to an embodiment.

FIG. 9 is a flow chart illustrating a method according to an embodiment. The method comprises controlling 900 the discharge switch to discharge the capacitor and clearing 902 a counter. The circuit is thus ready for commencing measurement, wherein a state of the switch is changed 904 to enable charging of the capacitor and clock signal pulses are counted 906 until the comparator provides 908 the signal when voltage across the capacitor reaches the voltage across the resistor. The parameter $N_{mn}$ as described above is thereby determined. A computation or lookup table check is then made to determine 910 a calibration measurement from the counted number of clock signal pulses.

Figure 10:
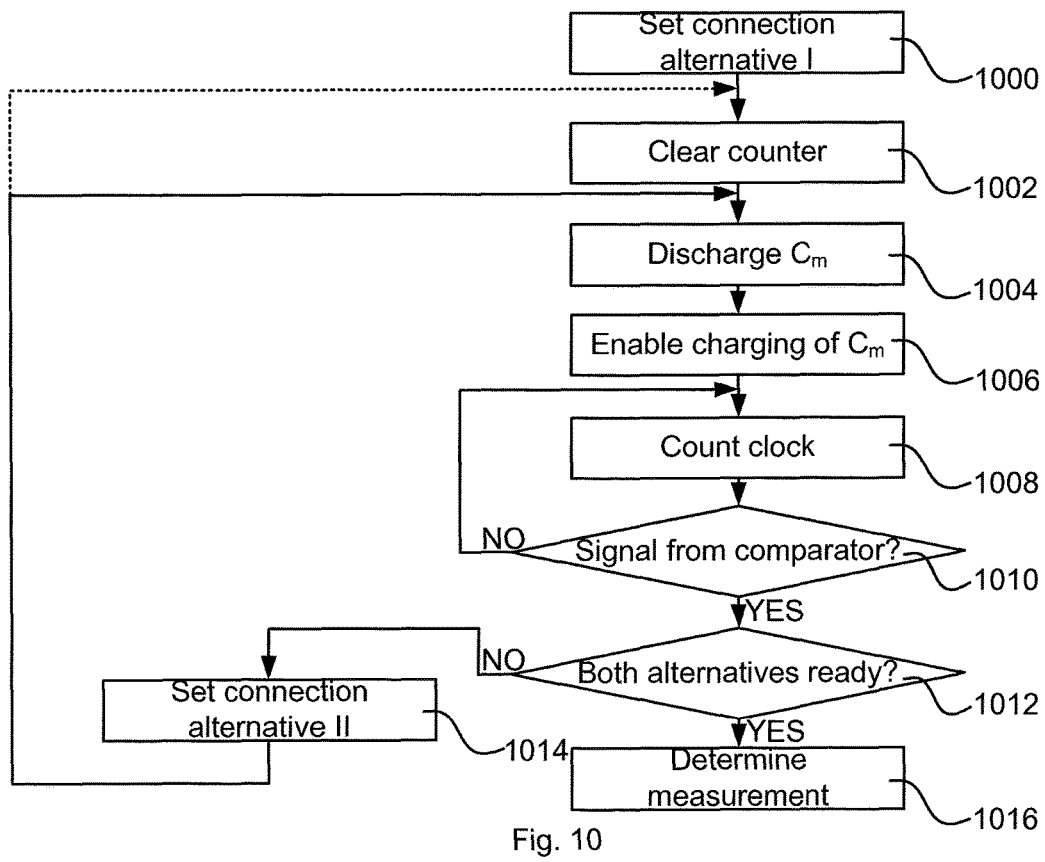
FIG. 10 is a flow chart illustrating a method according to an embodiment.

FIG. 10 is a flow chart illustrating a method according to an embodiment suitable for example for any of the circuits demonstrated with reference to FIG. 3, 4 or 5 above. In particular, the method is for calibration measurement of an RC circuit. A first connection alternative for the switching arrangement is set 1000, a counter is cleared 1002 and the capacitor is discharged 1004. The circuit is thus ready for commencing measurement, wherein a state of the switch is changed 1006 to enable charging of the capacitor and clock signal pulses are counted 1008 until the comparator provides 1010 the signal when voltage across the capacitor reaches the voltage across the resistor. It is checked 1012 whether both connection alternatives are performed, and since they are not in this example, the procedure continues with setting 1014 the second connection alternative by the switching arrangement, and the procedure repeats steps 1004 to 1012 for the second connection alternative. In the checking 1012 whether both connection alternatives are measured, the procedure continues with computation or lookup table check to determine 1016 a calibration measurement from the counted number of clock signal pulses. Optionally, the counter may be cleared between the two measurements, and thus stored before clearing, but since it is practical to aggregate the counts to achieve an average value, as demonstrated above, it is preferable that after setting 1014 to the second alternative connection, the procedure continues with step 1004.

Figure 11:
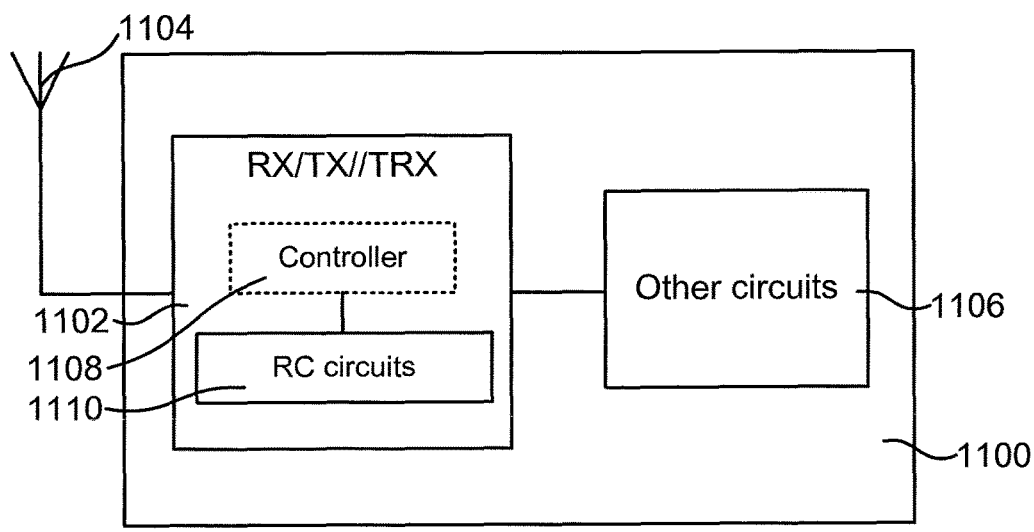
FIG. 11 is a block diagram schematically illustrating a communication device 1100 according to an embodiment.

FIG. 11 is a block diagram schematically illustrating a communication device 1100 according to an embodiment. The communication device 1100 comprises a receiver, transmitter or transceiver arrangement 1102 which comprises one or more RC circuits 1110 as those demonstrated above, e.g. one or more filters. The one or more RC circuits 1110 also comprises the calibration measurement RC circuit as described with reference to any one of FIGS. 2 to 5 above. The receiver, transmitter or transceiver arrangement 1102 may be connected to an antenna 1104 through its antenna port. The communication device 1100 can also comprise other circuits 1106, such as interface towards a user and/or other circuitry or machines, memory, processor, etc. The communication device 1100 can be a smartphone or cellphone, a communication card or device in or for a computer, an embedded communication device in a machine, or the like. The communication device 1100 can be adapted for cellular communication, point-to-point communication, or for communication in a wireless or wired network.

The antenna port described above need not necessarily by connected to an antenna, but can equally be connected to a wired line which conveys radio frequency signals. Thus, the communication device 1100 described with reference to FIG. 11 need not comprise the antenna 1104 wherein the communication device is instead connected to such a wired line conveying radio frequency signals.

The receiver or transceiver arrangement 1102 can comprise a controller 1108 for controlling the operation of the receiver, transmitter or transceiver arrangement 1102. The controller 1108 can be arranged to perform the operations of the calibration measurements as demonstrated above, e.g. control, computation, lookup table access, etc. In particular, the calibration measurement is for calibration measurement of an RC circuit.

Figure 12:
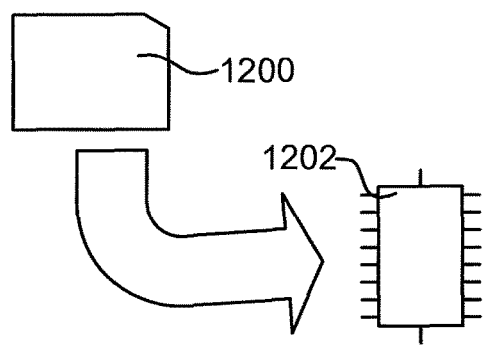
FIG. 12 schematically illustrates a computer-readable medium and a processing device.

The methods according to the present invention are suitable for implementation with aid of processing means, such as computers and/or processors, especially for the case where for example a baseband processor can be used for the control and computations or other controller used in connection with the circuits to be calibrated. Therefore, there is provided computer programs, comprising instructions arranged to cause the processing means, processor, or computer to perform the steps of any of the methods according to any of the embodiments described with reference to FIG. 9 or 10. The computer programs preferably comprises program code which is stored on a computer readable medium 1200, as illustrated in FIG. 12, which can be loaded and executed by a processing means, processor, or computer 1202 to cause it to perform the methods, respectively, according to embodiments of the present invention, preferably as any of the embodiments described with reference to FIG. 9 or 10. The computer 1202 and computer program product 1200 can be arranged to execute the program code sequentially where actions of the any of the methods are performed stepwise. The processing means, processor, or computer 1202 is preferably what normally is referred to as an embedded system. Thus, the depicted computer readable medium 1200 and computer 1202 in FIG. 12 should be construed to be for illustrative purposes only to provide understanding of the principle, and not to be construed as any direct illustration of the elements.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A circuit for calibration measurements comprising
a first and a second current source arranged to provide current outputs;

a resistor connected between the first current source and a reference voltage;

a capacitor connected between the second current source and the reference voltage;

a discharge switch connected in parallel with the capacitor and arranged to selectively discharge the capacitor;

a comparator circuit arranged to compare voltages across the resistor and the capacitor and output a signal when a voltage across the capacitor reaches the voltage across the resistor;

a controller having a clock signal input and connected to the output of the comparator circuit, wherein the controller is arranged to control the discharge switch to discharge the capacitor, change state of the switch to enable charging of the capacitor and count clock signal pulses until the comparator provides the signal when voltage across the capacitor reaches the voltage across the resistor, wherein the controller is arranged to determine a calibration measurement from counted number of clock signal pulses; and a switching arrangement enabling an alternative connection comprising that the second current source is selectably connected to the resistor instead, and the first current source is selectably connected to the capacitor instead, wherein the controller further is arranged to control enabling of the alternative connection and to make a second determination of counted clock signals for the alternative connection, and the calibration measurement is determined from the two counts of clock signal pulses.

2. The circuit of claim 1, wherein the switching arrangement comprises:

a first switch having an input connected to the first current source and arranged to selectively connect the first current source to either a first node connected to a first terminal of the resistor and a first input of the comparator, or a second node connected to a first terminal of the capacitor and a second input of the comparator; and a second switch having an input connected to the second current source and arranged to selectively connect the second current source to either the second node or the first node.

3. The circuit of claim 1, wherein the switching arrangement is also arranged to enable a swap of the comparator inputs with each other.

4. The circuit of claim 3, wherein the switching arrangement comprises a first switch having an input connected to the first current source and a first input of the comparator and arranged to selectively connect the first current source to either a first node connected to a first terminal of the resistor, or a second node connected to a first terminal of the capacitor; and a second switch having an input connected to the second current source and a second input of the comparator and arranged to selectively connect the second current source to either the second node or the first node.

5. The circuit of claim 1, further comprising a filter capacitor connected in parallel with the resistor and arranged to low-pass filter noise caused by the resistor.

6. The circuit of claim 1, wherein a calibration value is determined from the calibration measurement through a look-up table mapping calibration measurements to calibration values.

7. The circuit of claim 1, wherein a calibration value is determined from the calibration measurement through a computing arrangement arranged to compute a ratio between the counted number of clock pulses and a value indicating a number of clock pulses associated with a desired combination of resistance and capacitance.

8. The circuit of claim 7, wherein a compensation value for systematic latency in the circuit is provided, wherein a denominator of the ratio comprises a difference between the counted number of clock pulses and the compensation value.

9. The circuit of claim 7, wherein the resistor has a programmable resistance controlled by a resistor control value, and/or the capacitor has a programmable capacitance controlled by a capacitance control value, wherein the computation arrangement is arranged to adjust the calibration value for the setting of resistor control value and/or capacitor control value at the calibration measurement.

10. The circuit of claim 7, wherein computations by the computation arrangement are made for a plurality of programmable resistor or capacitance values and are stored for each programmable value, wherein the resistor or capacitance value is comprised in the denominator of the ratio.

11. An electronic device comprising a circuit of claim 1.

12. The electronic device of claim 11, being a communication apparatus.

13. A method for a calibration measurement circuit that has:

a first and a second current source arranged to provide current outputs;

a resistor connected between the first current source and a reference voltage;

a capacitor connected between the second current source and the reference voltage;

a discharge switch connected in parallel with the capacitor and arranged to selectively discharge the capacitor;

a comparator circuit arranged to compare voltages across the resistor and the capacitor and output a signal when a voltage across the capacitor reaches the voltage across the resistor, wherein the method comprises:

controlling the discharge switch to discharge the capacitor;

clearing a counter;

changing a state of the switch to enable charging of the capacitor;

counting clock signal pulses until the comparator provides the signal when voltage across the capacitor reaches the voltage across the resistor;

determining a calibration measurement from the counted number of clock signal pulses;

forming an alternative connection comprising that the second current source is connected to the resistor instead, and the first current source is connected to the capacitor instead; and making a second determination of counted clock signals for the alternative connection, wherein the calibration measurement is determined from the two counts of clock signal pulses.

14. The method of claim 13, wherein the forming of the alternative connection also comprises swapping the comparator inputs with each other.

15. The method of claim 13, comprising determining a calibration value from the calibration measurement through a look-up table mapping calibration measurements to calibration values.

16. The method of claim 13, comprising determining a calibration value from the calibration measurement by computing a ratio between the counted number of clock pulses and a value indicating a number of clock pulses associated with a desired combination of resistance and capacitance.

17. The method of claim 16, comprising providing a compensation value for systematic latency in the circuit, wherein a denominator of the ratio comprises a difference between the counted number of clock pulses and the compensation value.

18. The method of claim 16, wherein the resistor has a programmable resistance controlled by a resistor control value, and/or the capacitor has a programmable capacitance controlled by a capacitance control value, wherein the method comprises adjusting the calibration value for the setting of resistor control value and/or capacitor control value at the calibration measurement.

19. The method of claim 16, comprising
   computing calibration values for a plurality of programmable resistor or capacitance values; and
   storing the computed calibration values for each programmable value,
   wherein the resistor or capacitance value is comprised in the denominator of the ratio.

20. A nontransitory computer readable medium comprising a computer program that comprises computer executable instructions which when executed by a programmable controller of an electronic circuit for performing calibration measurements causes the controller to perform a method for a calibration measurement circuit that has:
   a first and a second current source arranged to provide current outputs;
   a resistor connected between the first current source and a reference voltage;
   a capacitor connected between the second current source and the reference voltage;
   a discharge switch connected in parallel with the capacitor and arranged to selectively discharge the capacitor;
   a comparator circuit arranged to compare voltages across the resistor and the capacitor and output a signal when a voltage across the capacitor reaches the voltage across the resistor,
   wherein the method comprises:
   controlling the discharge switch to discharge the capacitor;
   clearing a counter;
   changing a state of the switch to enable charging of the capacitor;
   counting clock signal pulses until the comparator provides the signal when voltage across the capacitor reaches the voltage across the resistor; and
   determining a calibration measurement from the counted number of clock signal pulses;
   forming an alternative connection comprising that the second current source is connected to the resistor instead, and the first current source is connected to the capacitor instead; and
   making a second determination of counted clock signals for the alternative connection,
   wherein the calibration measurement is determined from the two counts of clock signal pulses.

* * * * *